United States Patent
Daubenspeck et al.

(10) Patent No.: US 9,105,465 B2
(45) Date of Patent: Aug. 11, 2015

(54) WAFER EDGE CONDITIONING FOR THINNED WAFERS

(75) Inventors: Timothy Harrison Daubenspeck, Colchester, VT (US); Jeffrey P. Gambino, Westford, VT (US); Christopher David Muzzy, Burlington, VT (US); Wolfgang Sauter, Hinesburg, VT (US); Timothy Dooling Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 946 days.

(21) Appl. No.: 13/053,803

(22) Filed: Mar. 22, 2011

(65) Prior Publication Data

US 2012/0241916 A1    Sep. 27, 2012

(51) Int. Cl.
*H01L 29/02*    (2006.01)
*H01L 21/02*    (2006.01)

(52) U.S. Cl.
CPC .............. *H01L 21/02021* (2013.01)

(58) Field of Classification Search
CPC ................................. H01L 21/02021
USPC ........... 257/622, E21.214, E29.002; 438/455, 438/691, 700

IPC .................................................. H01L 21/02021
See application file for complete search history.

(56) References Cited

U.S. PATENT DOCUMENTS

| | | | |
|---|---|---|---|
| 6,113,721 A * | 9/2000 | Secco d'Aragona et al. . | 156/154 |
| 2003/0232580 A1 | 12/2003 | Mashino | |
| 2008/0044984 A1 | 2/2008 | Hsieh et al. | |
| 2010/0255682 A1* | 10/2010 | Trickett et al. ................ | 438/692 |
| 2012/0241916 A1* | 9/2012 | Daubenspeck et al. ....... | 257/622 |

* cited by examiner

*Primary Examiner* — Hrayr A Sayadian
(74) *Attorney, Agent, or Firm* — David A. Cain

(57) ABSTRACT

The present invention relates to a method for minimizing breakage of wafers during or after a wafer thinning process. A method of forming a rounded edge to the portion of a wafer remaining after surface grinding process is provided. The method comprises providing a semiconductor wafer having an edge and forming a recess in the edge of the wafer using any suitable mechanical or chemical process. The method further comprises forming a substantially continuous curved shape for at least the edge of the wafer located above the recess. Advantageously, the shape of the wafer is formed prior to the backside grind process to prevent problems caused by the otherwise presence of a sharp edge during the backside grind process.

8 Claims, 5 Drawing Sheets

WAFER EDGE CONDITIONING FOR THINNED WAFERS

BACKGROUND

Field of the Invention

The present invention relates to a method for minimizing breakage of wafers during and after a wafer thinning process, and more particularly, to a wafer edge conditioning for thinned wafers.

Presently, three dimensional structures composed of stacked microelectronics chips can be made by inserting electrical pathways through the silicon chip to allow electrical transmission from one side of the chip to the other. These vertical electrical connections passing completely through a silicon wafer are commonly known as Through-Silicon-Vias (TSVs). In order to have a relatively high density of such TSVs, the diameter of each TSV must be relatively small compared to the chip dimensions. Dimensions in the range between about 10 µm and about 50 µm are common. However, chip thickness, lying within the range of about 0.3 mm to about 1.3 mm, makes it difficult to form a 10 µm TSV entirely through the wafer. To circumvent this problem, TSV's may be formed to a depth of about 50 µm to about 100 µm in the thick wafer, and then the wafer may be ground down to a final thickness of between about 50 µm and about 150 µm, exposing the TSV metal on the wafer back side.

After the thinning process wafers typically become more delicate and prone to damage by either handling or by intrinsic forces or even by some combination of both. For example, the metal fill used to make the TSVs can develop tensile or compressive stresses that will cause the wafer to bow to the extent that it is no longer flat enough to be processed by automatic deposition equipment. If the deformed wafer is forced to lie flat, then the stresses produced can cause the wafer to break. As another example, if the edge of the wafer is nicked or damaged during transfer into or out of a deposition chamber, the inherent forces can be sufficient to propagate a crack, nucleated at the wafer edge, entirely across the wafer, making further processing substantially impossible. These examples underscore the importance of the integrity of the wafer edge, which is typically left with a vulnerable shape that is very prone to damage. The finished edge of a wafer as received is normally polished smooth and rounded. However, this edge is substantially changed by the wafer thinning process, which typically grinds away at least about 85% of the wafer thickness and typically produces nicks and micro cracks in the process.

Accordingly, there exists a need in the art to overcome the deficiencies and limitations described hereinabove.

SUMMARY

In one aspect of the invention, a method of forming a rounded edge to the portion of a wafer remaining after a surface grinding process comprises providing a semiconductor wafer having an edge and forming a recess in the edge of the wafer. The method further comprises forming a substantially continuous curved shape for at least the edge of the wafer located above the recess.

In another aspect of the invention, a method of forming a rounded edge to the portion of a wafer remaining after a surface grinding process comprises providing a semiconductor wafer having a top surface, a bottom surface and an edge and applying a protective coating to the top and bottom surfaces of the semiconductor wafer. The method further comprises forming a recess in the edge of the wafer. Additionally, the method comprises forming a substantially continuous curved shape for at least the edge of the wafer located above the recess and then removing the protective coating from the surfaces.

In another aspect of the invention, a semiconductor wafer structure is provided. The semiconductor wafer structure comprises a top surface, a bottom surface and an edge having a substantially continuous curved shape having a top curved portion, a groove portion and a bottom curved portion.

A more complete understanding of the present invention, as well as further features and advantages of the present invention, will be obtained by reference to the following detailed description and drawings. It is to be understood that both the foregoing general description and the following detailed description are exemplary and explanatory only, and should not be considered restrictive of the scope of the invention, as described and claimed. Further, features or variations may be provided in addition to those set forth herein. For example, embodiments of the invention may be directed to various combinations and sub-combinations of the features described in the detailed description.

BRIEF DESCRIPTION OF THE SEVERAL VIEWS OF THE DRAWINGS

The present invention is described in the detailed description which follows in reference to the noted plurality of drawings by way of non-limiting examples of exemplary embodiments of the present invention.

DETAILED DESCRIPTION

The present invention relates to a method for minimizing breakage of wafers during or after a wafer thinning process, and more particularly, to a wafer edge conditioning for thinned wafers. More specifically, the present invention comprises a method of forming a rounded edge to the portion of a wafer remaining after surface grinding process. The method comprises providing a semiconductor wafer having an edge and forming a recess in the edge of the wafer. The method further comprises forming a substantially continuous curved shape for at least the edge of the wafer located above the recess. Advantageously, the shape of the wafer is formed prior to the backside grind process to prevent problems caused by the otherwise presence of a sharp edge during the backside grind process.

Typically, semiconductor wafers are provided having the edges polished smooth and rounded to prevent "crowning" when an epitaxial layer is grown on the surface of the substrate. However, the grinding process substantially changes the edge of the wafer. More specifically, this process leaves a sharp corner at the edge of the wafer as discussed below, making the wafer more vulnerable to damage. The thinned wafer is very delicate and any effort to smooth the wafer edge after grinding may in turn cause the breakage that is to be avoided. Embodiments of the present invention contemplate creating an edge profile that already has the rounded edge desired in the finished thin wafer.

Figure 1:
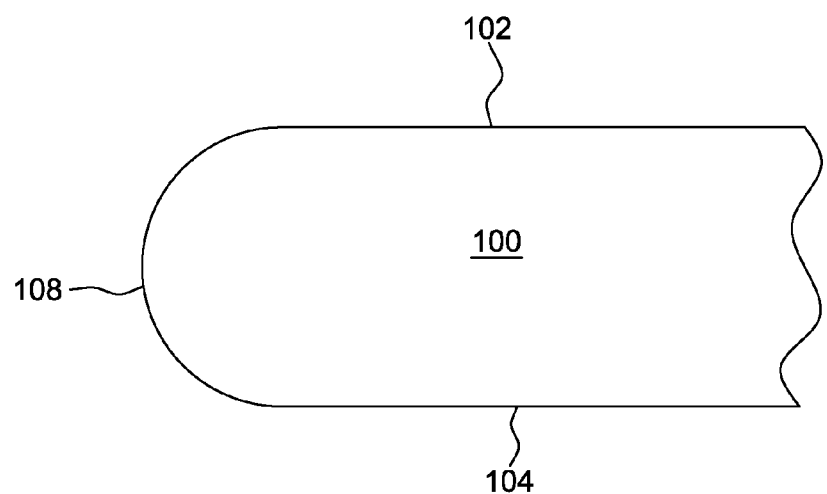
FIG. 1 is a cross-section view of a wafer edge.

FIG. 1 is a cross-section view of the edge of a wafer. Shown in FIG. 1 is the wafer 100 having a top surface 102 and a bottom surface 104. Wafer 100 also has a rounded edge 108. Wafer 100 can be comprised of any semiconductor materials, or combinations thereof, for example, but not limited to, silicon, polysilicon, or gallium arsenide. Top surface 102 is the "active surface", i.e., it will contain device wiring and other circuitry.

Figure 2:
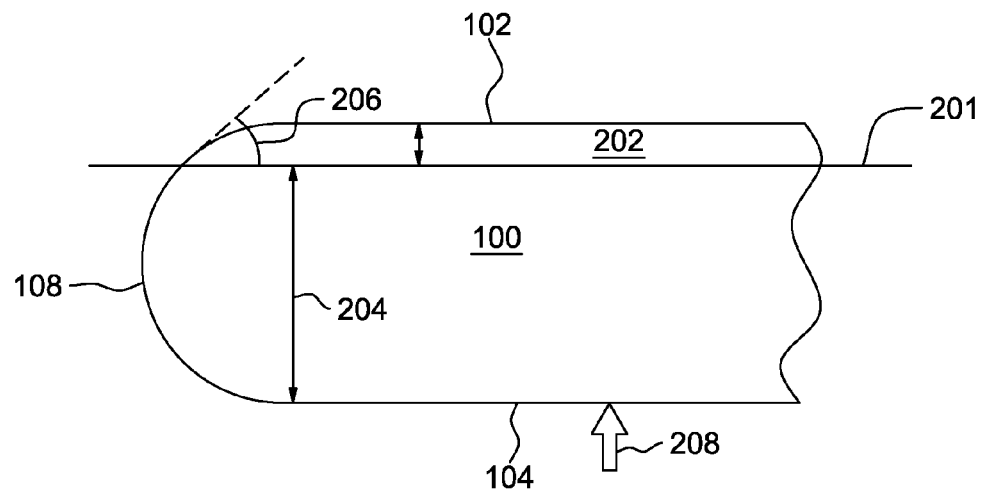
FIG. 2 is another cross-section view of the edge of the wafer of FIG. 1 illustrating a polishing plane.

FIG. 2 is another cross-section view of the wafer edge of FIG. 1 illustrating a polishing plane. This figure shows a polishing plane 201, which is parallel to the top 102 and bottom 104 surfaces. As previously noted, the wafer 100 is thinned by grinding (or other appropriate process) to achieve a desired thickness. In one embodiment of the invention, the wafer 100 is ground to a thickness of approximately 50 microns. In the present process, the wafer 100 will be ground from the bottom surface 104 as shown by the arrow 208 in FIG. 2. A portion 204 of the wafer that is below polishing plane 201 will be removed by a grinding process. A portion 202 of the wafer that is above polishing plane 201 will remain after the grinding process. This grinding process leaves a sharp angle 206 of about 45 degrees or less at the edge of wafer 100. Sharp angle 206 makes wafer 100 more vulnerable to damage.

Figure 3:
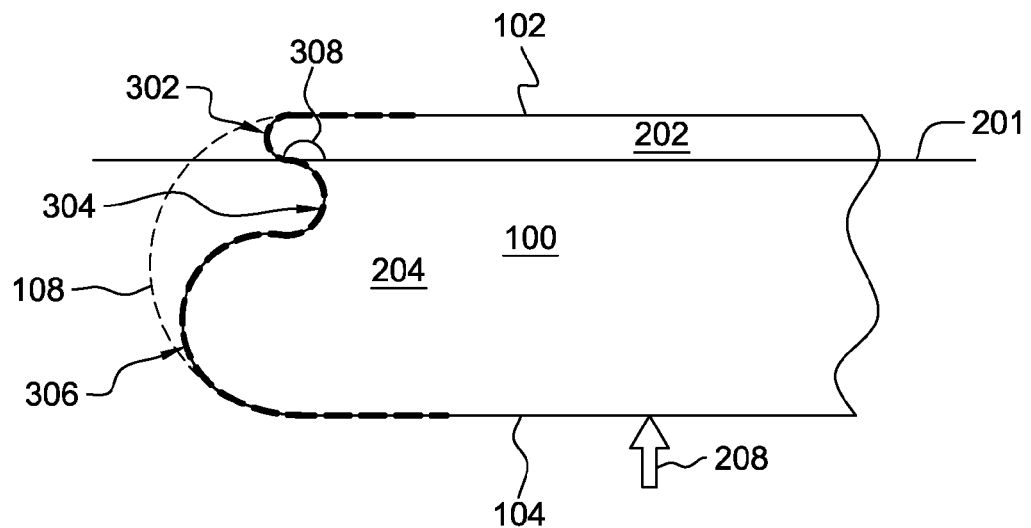
FIG. 3 is a cross-section view of a wafer edge having an edge profile in accordance with one embodiment of the present invention.
Figure 4:
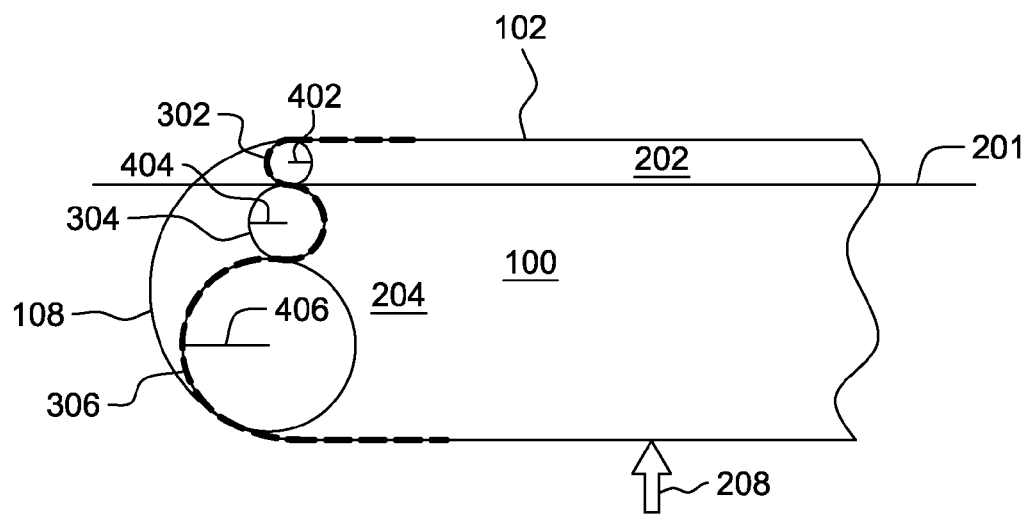
FIG. 4 is a cross-section view of a wafer edge having an edge profile of FIG. 3 illustrating a radius of curvature for each portion of the edge in accordance with one embodiment of the present invention.

This damage may be avoided by creating an edge profile that already has the rounded edge 302 in the portion 202 of the wafer that will remain after the grinding process as shown in FIG. 3. FIG. 3 is a cross-section view of a wafer edge having an edge profile in accordance with one embodiment of the present invention. According to one embodiment of the present invention, the desired edge will have a substantially continuous curved shape and may comprise a top curved portion 302, a groove portion 304 and a bottom curved portion 306. FIG. 4 is a cross-section view of a wafer edge having an edge profile of FIG. 3 illustrating a radius of curvature for each portion of the edge in accordance with one embodiment of the present invention. In this embodiment, top curved portion 302 has a radius of curvature 402 of between about 25 µm and about 50 µm, groove portion 304 has a radius of curvature 404 of between about 30 µm and about 150 µm, and a bottom curved portion 306 has a radius of curvature 406 of between about 300 µm and about 450 µm as shown in FIG. 4. It should be understood that the curvature may not have a substantially uniform radius, and that the radii of curvature disclosed herein represent those of a circular shape that best fits the final edge profile after processing. It must be noted that if the radius of the curvature 404 of groove portion 304 is comparable to or larger than the radius of curvature 402 of top curved portion 302, then angle 308 remaining after grinding will be in the range of 150 to 175 degrees, as shown in FIG. 3. By eliminating the sharp angle of the edge (the likely inception point of the breakage) prior to the thinning process, wafer breakage may be effectively reduced or eliminated.

Figure 5A:
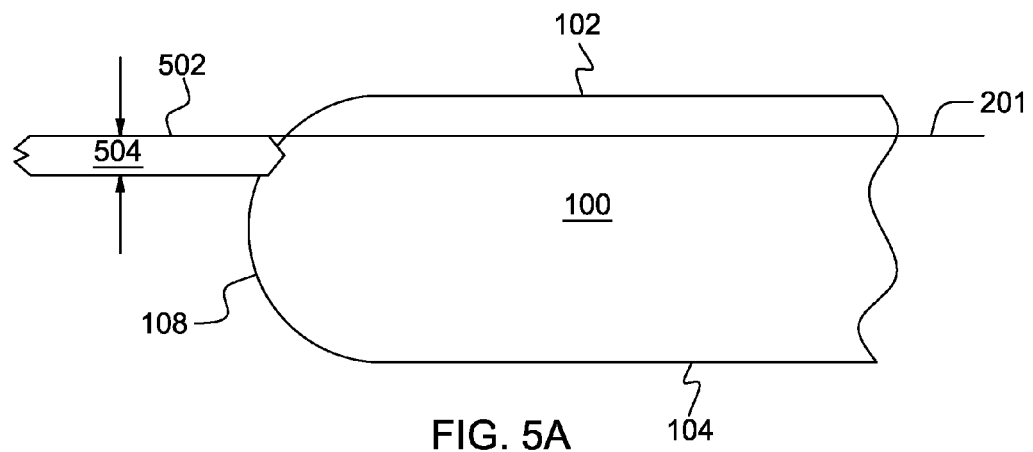
FIGS. 5A through 5C show the process steps associated with the inventive wafer edge conditioning process.
Figure 5B:
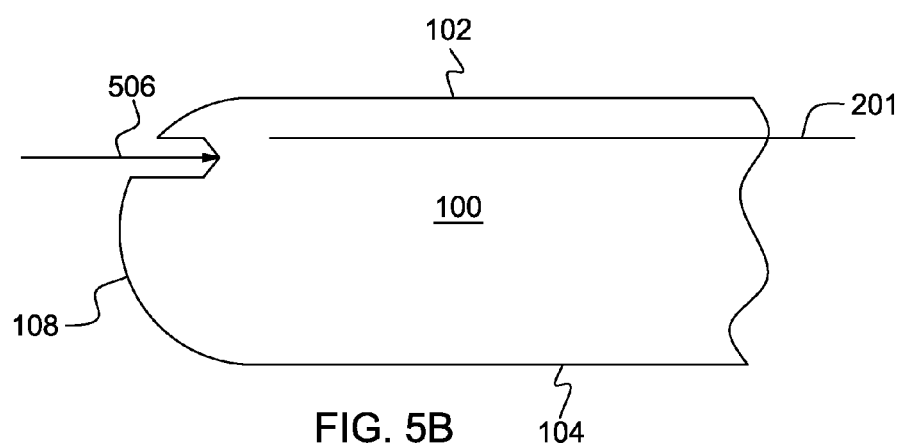
Figure 5C:
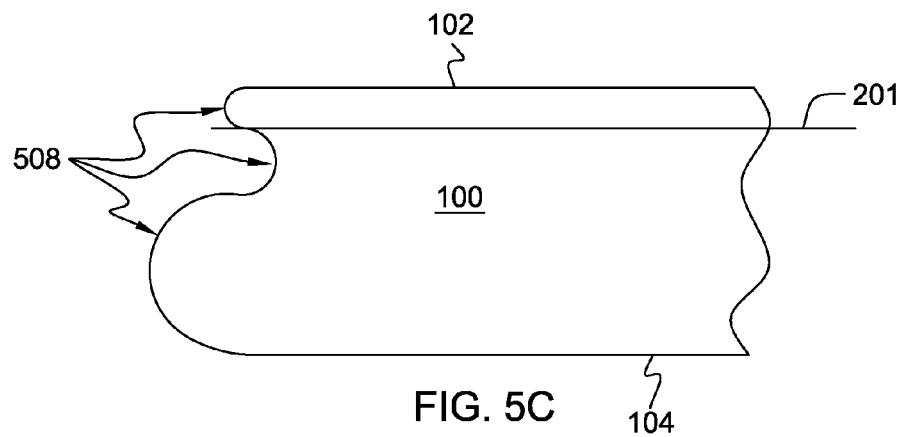

FIGS. 5A through 5C show the process steps associated with the inventive wafer edge conditioning process. FIG. 5A is a cross-section view of the edge of wafer 100 having a top surface 102 and a bottom surface 104. The wafer edge conditioning process starts with defining a polishing plane of the wafer by determining a desired thickness of the thinned wafer. FIG. 5A shows the use of a conventional diamond saw to remove a portion of the edge 108 of the wafer 100. In a preferred embodiment the diamond blade has a thickness 504 of about 80 microns. As can be seen in FIG. 5B, the cutting blade 502 is positioned so that it makes a circumferential incision right below the polishing plane 201. In one embodiment the blade 502 is positioned so that the depth of the incision is from about 300 µm to about 400 µm, and preferably about 350 µm for an 80 µm thick blade. It must be noted that the depth of the incision will depend on the thickness of the saw blade and the desired final thickness of the ground wafer. The incision can be done by holding the wafer on a rotating mandrel and then bringing it slowly into lateral contact with the spinning saw. Alternatively, the incision can be made by keeping wafer 100 stationary and rotating the spinning blade 502 around the radius of the wafer 100.

Once the blade 502 has been used to produce an incision of the desired depth 506, wafer edge 108 can be polished to produce rounded edges 508 as shown in FIG. 5C. For example, an abrasive polishing method may be utilized. Abrasive polishing methods typically use an abrasive polishing tool (such as an abrading plate) which comprises cerium-oxide ($CeO_2$) or other abrasive particles bound in a binder comprised of phenol resin, or the like. This method uses an abrading plate harder than a conventional polishing cloth, which allows one to preferentially polish the edge. Consequentially, a substantially continuous rounded shape of the polished surface can be obtained easily. Furthermore, the fixed abrasive polishing tool can provide a self-stopping function. Thus, it can automatically stop to avoid excessive polishing.

In an alternative to abrasive polishing, a chemical etching process may be utilized using an appropriate mask. This etching can be carried out using conventional photolithography methods, and in particular, resin mask representing the desired rounded edges 508. Yet another alternative is to utilize some combination of both abrasive polishing and chemical etching processes. In order to produce the smoothest surface of edges 508, the final step would be to perform a conventional light chemical etch.

An alternative fabrication process of producing the groove incorporates coating wafer 100 with a liquid protective coating. The protective coating is formed on the top surface 102 of the wafer. The protective coating can be a liquid, for example, but not limited to, lacquer or polyimide, that is resistant to the silicon etching solution. It can be applied by various techniques, for example, but not limited to, spray coating, roll coating, curtain coating, brush-type coating, spin coating. Thereafter, the coated wafer may be cured if needed to achieve a coated, cured wafer. In an embodiment, curing is carried out in a temperature range from about 100 degrees to about 300 degrees Celsius. Following the cure, a thin strip could be removed from the coated cured wafer producing a recess in the rounded edge of a depth equal to desired depth of the groove. The recess may be produced by a slight scoring with a mechanical saw. Alternatively, a recess may be produced by a widely known technique of laser ablation. Subsequent exposure of the wafer edge to the isotropic silicon etch produces a groove parallel to the wafer surface. Subsequently, the protective coating may be removed and the edge may be abraded or etched, as described above to produce the desired profile.

Figure 6A:
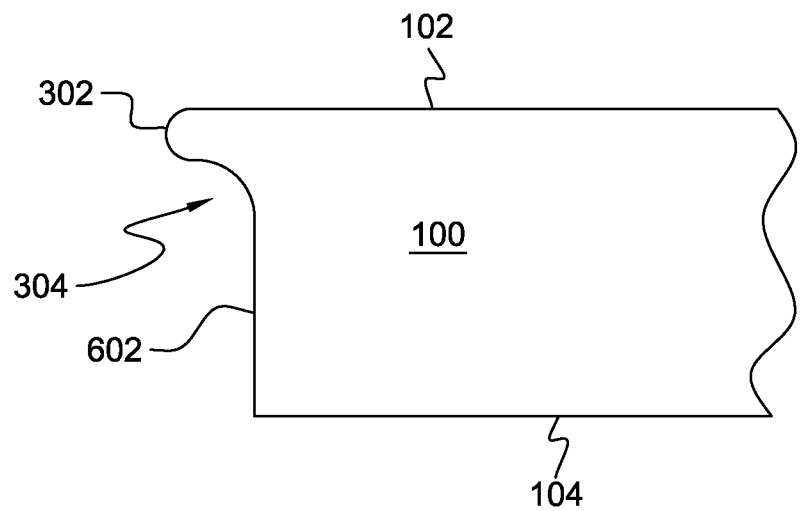
FIGS. 6A through 7B illustrate alternative embodiments of the edge profile shown in FIG. 3.
Figure 6B:
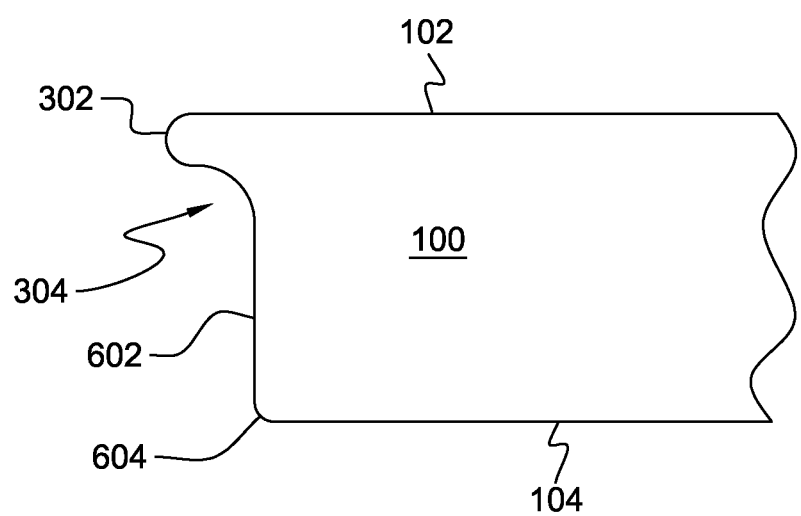

FIGS. 6A through 7B illustrate alternative embodiments of the edge profile shown in FIG. 3. In one embodiment, shown in FIG. 6A, the desired edge will comprise a top curved portion 302, a groove portion 304 and a bottom portion 602 that is substantially perpendicular to the bottom surface of wafer 104. In this embodiment the radius of the curvature of the groove portion 304 is between about 30 µm and about 150

µm, as indicated above. FIG. 6B shows another embodiment having the edge profile substantially similar to the edge profile of FIG. 6A, but the bottom portion of the edge has a rounded bottom corner 604.

Figure 7A:
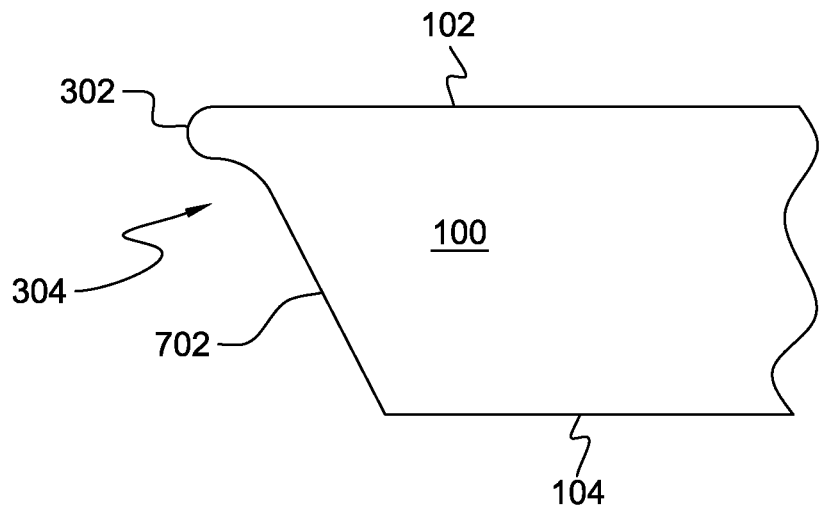
Figure 7B:
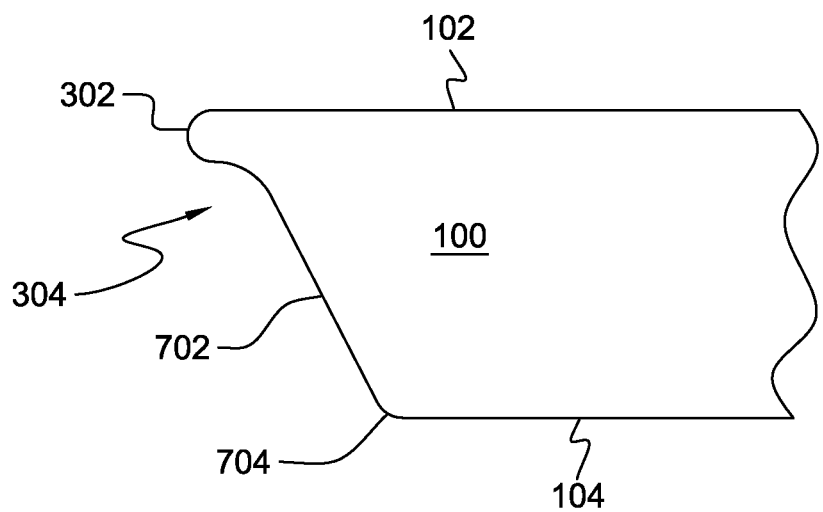

In another embodiment shown in FIG. 7A, the desired edge will comprise a top curved portion 302, a groove portion 304 and a bottom tapered portion 702. In this embodiment the radius of the curvature of the groove portion is between about 30 µm and about 150 µm and the angle of the tapered portion is about 30 degrees. FIG. 7B shows another embodiment having the edge profile substantially similar to the edge profile of FIG. 7A, but the tapered portion of the edge 702 has a rounded bottom corner 604.

Thus, as described above, the present invention comprises forming a substantially continuous curved shape for at least the edge of the wafer located in the portion that will remain after the grinding process. Advantageously, the curved shape for the edge is formed prior to the thinning process to prevent any damage during that process.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method for thinning a semiconductor wafer to a desired final thickness, the method comprising:
   providing a semiconductor wafer having a top surface, a bottom surface, and an edge;
   forming a substantially continuous curved shape in the edge, the curved shape having:
      a first convex shape at the top surface having radius of curvature such that twice the radius of curvature is approximately, but not less than, the desired final thickness;
      a concave shape adjacent to the first convex shape and having a radius of curvature greater than the first convex shape; and
      a second convex shape adjacent to the concave shape and at the bottom surface having a radius of curvature greater than the concave shape; and
   thinning the semiconductor wafer from the bottom surface to the desired thickness.

2. The method of claim 1, wherein forming the substantially continuous curved shape comprises:
   forming a recess in the edge of the wafer; and
   polishing the edge of the wafer.

3. The method of claim 2, further comprising etching the edge of the wafer after forming the recess so as to produce a substantially smooth surface.

4. The method of claim 2, wherein forming the recess further comprises making a circumferential incision with a diamond blade.

5. The method of claim 4, wherein the diamond blade has a thickness of about 80 microns.

6. The method of claim 2, wherein the recess has a depth substantially equal to a predetermined depth of a desired groove.

7. The method of claim 2, wherein the polishing comprises mechanical abrasion of the edge.

8. The method of claim 1, wherein, after thinning the semiconductor wafer to the desired final thickness, the angle between the thinned surface and the edge is in the range of 150 to 175 degrees.

* * * * *